United States Patent [19]

Kimura et al.

[11] Patent Number: 4,683,838
[45] Date of Patent: Aug. 4, 1987

[54] PLASMA TREATMENT SYSTEM

[75] Inventors: Shin-Ichiro Kimura, Hachioji; Eiichi Murakami, Kokubunji; Terunori Warabisako, Tokyo; Kiyoshi Miyake, Kanagawa; Hideo Sunami, Tokyo, all of Japan

[73] Assignee: Hitachi, Ltd., Tokyo, Japan

[21] Appl. No.: 750,474

[22] Filed: Jul. 1, 1985

[51] Int. Cl.$^4$ ............................................. C23C 16/00
[52] U.S. Cl. ................................... 118/715; 118/723; 118/726; 427/38; 427/39
[58] Field of Search ...................... 118/715, 723, 726; 427/38, 39

[56] References Cited

U.S. PATENT DOCUMENTS

| 4,217,374 | 8/1980 | Ovshinsky | 427/86 |
| 4,401,054 | 8/1983 | Matsuo | 118/723 |
| 4,481,229 | 11/1984 | Suzuki | 427/38 |
| 4,483,725 | 11/1984 | Chang | 148/175 |
| 4,514,437 | 4/1985 | Nath | 118/723 |
| 4,516,525 | 5/1985 | Bourgeois | 118/762 |
| 4,610,770 | 9/1986 | Saito | 204/192.1 |

FOREIGN PATENT DOCUMENTS 014896  8/1979  Japan .

OTHER PUBLICATIONS

P. C. Karr "Vacuum Deposition of Material Films on Substrates Utilizing Controlled Plasma", IBM Technical Disclosure Bulletin, vol. 19, No. 5, Oct. 1976, pp. 1518-1520.

Primary Examiner—John D. Smith
Assistant Examiner—Vi D. Dang
Attorney, Agent, or Firm—Antonelli, Terry & Wands

[57] ABSTRACT

An insulator film can be formed at a low temperature without any damage to a substrate to be treated by a plasma in a plasma treatment system which comprises a magnetron for generating a microwave, an isolator for isolating a wave guide from the magnetron, a discharge tube for generating a plasma, the wave guide for leading the microwave from the magnetron to the discharge tube, a vacuum chamber integrally formed together with the discharge tube, an evaporation source provided in the vacuum chamber, a substrate to be treated and provided at a position to sandwich a stream of the plasma between the substrate and the evaporation source, electromagnets provided around the discharge tube and the vacuum chamber, and a manipulator for manipulating the substrate, the electromagnets generating a magnetic field to confine the stream of the plasma.

13 Claims, 9 Drawing Figures

PLASMA TREATMENT SYSTEM

BACKGROUND OF THE INVENTION

This invention relates to a plasma treatment system, particularly to a plasma treatment system suitable for suppressing irradiation damage of a substrate by charged particles in plasma and for forming an oxide film or nitride film containing no hydrogen.

In the production of IC or LSI, insulator films of $SiO_2$, $Si_3N_4$, etc. are much used as an interlevel insulator film, insulator film for charge storage capacitor, or a gate insulator film, and these insulator films are produced using a high temperature process, for example, by CVD (chemical vapor deposition), by thermal oxidation, etc. However, the process requires a heat treatment at a temperature as high as 1,000° C., and thus is less applicable to a step where high temperature heat treatment is undesired, such as the final step in the LSI production, or inapplicable to production of thin film transistors, etc. using low melting point substrates.

To overcome the disadvantages of the high temperature CVD process, a plasma CVD utilizing plasma of a reactive gas, which will be hereinafter referred to as PCVD, has been recently regarded as important. According to PCVD, a reactive gas containing Si as a component atom such as monosilane ($SiH_4$), and an oxygen gas or other gas such as a nitrogen gas or an ammonia gas are supplied to a chamber made of stainless steel, etc. at the same time, and a DC or AC high electric field is applied thereto from an external source while maintaining these gases in a dilute state, thereby generating a plasma and depositing $SiO_2$, $Si_3N_4$, etc. on a substrate.

In FIG. 1 a parallel plate-type, PCVD apparatus is schematically shown. A substrate to be treated, that is, wafer 11, is provided on one of two counterposed electrodes 12, and a DC or AC high voltage is applied between the two electrodes 12 from an electric source 13 to subject a dilute reactive gas to electric discharge. The reactive gas is decomposed by the electric discharge, and reacts with activated oxygen, nitrogen, etc. existing at the same time to form an insulator film on a substrate, where numeral 14 shows a matching box, 15 an earth shield, 16 an evacuation system, 17 a gas introduction system, and 18 a vacuum chamber. However, a high voltage is also applied to the substrate according to this process, and thus charged particles on a high kinetic energy level collide with the substrate to cause so-called irradiation damage. To overcome this disadvantage, it has been proposed to use a microwave PCVD apparatus, etc. utilizing a microwave discharge of 2.45 GHz as one of electrodeless discharges to restrict the substrate bias only to a floating potential of 10-20 volts.

According to these PCVD processes, it is possible to form an insulator film around room temperature, but the thus formed films have such a serious disadvantage that a large amount of hydrogen is contained in the films. The hydrogen is produced as a by-product from the decomposition of $SiH_4$ or $NH_3$, and easily discharged from the films at a high temperature CVD, whereas the hydrogen remains in the films in the case of PCVD because of the low substrate temperature. The hydrogen in the films acts as a trap source for electrons injected into the insulator films, causing fluctuations in the flat-band voltage or the threshold voltage. Particularly with recent advance in miniaturization of devices and thinner insulating films, electrons are more readily injected, and thus the hydrogen in the insulating film has been a serious problem in the long-term reliability of devices.

SUMMARY OF THE INVENTION

An object of the present invention is to lower a treatment temperature and reduce the hydrogen content of an insulating film.

Another object of the present invention is to provide a plasma treatment system capable of forming a good insulator film with less plasma irradiation damage on a substrate.

Another object of the present invention is to form an insulator film applicable to an important part such as a gate insulator film of a MOS transistor by utilizing a plasma.

So long as hydrogen-containing gases such as $SiH_4$ is used in the PCVD process, hydrogen is inevitably contained in the film. To completely solve the problem, a stream of plasma and a stream of evaporated metal atoms are independently generated in the present system and subjected to reaction in the vicinity of a substrate to be treated, thereby depositing the reaction product onto the substrate. To control an irradiation damage by charged particles in the plasma, the plasma is furthermore confined by an external magnetic field so that the substrate to be treated can be prevented from direct contact with the plasma. By the confinement of plasma, the reaction chamber can be prevented from contact with the plasma. Thus, contamination of the specimen by scraping the chamber wall by the plasma, that is, by the so-called sputtering, can be effectively controlled.

Principle and structure of the present system will be described in detail below, referring to specific examples.

In FIG. 2, the present plasma treatment system is schematically shown, where an insulator film is formed by making a stream of evaporated metal atoms 29 generated from an evaporation source 27 cross a stream of plasma 26. To effectively carry out the reaction between the plasma and the evaporated metal, it is necessary to obtain a plasma containing highly activated oxygen atoms or nitrogen atoms at a high concentration. To this end, a microwave discharge utilizing an electron cyclotron resonance is used in the present system. As shown in FIG. 2, a microwave of 2.45 GHz is generated by a magnetron 21 and is led to a discharge tube 32 through an isolator 22, a power monitor 23 and a wave guide 24. The discharge tube is filled with a dilute gas, where a discharge starts to take place. The discharge tube 32 is surrounded by electromagnets 25, whereby the charged particles in the plasma are put in a spiral motion so as to coil around the magnetic flux. The frequency of spiral motion is proportional to the mass of charged particles and the intensity of external magnetic field. When the frequency becomes equal to that of the microwave, the charged particles will absorb the microwave to increase the kinetic energy. This is called electron cyclotron resonance (ECR). To make the electrons absorb the microwave, it is necessary to use an external magnetic field of 875 gauss. In the present system, the magnetic field in the vicinity of the center of discharge tube has 875 gauss.

According to this discharge system, electric discharge can be continuously and stably carried out even in a dilute gas atmosphere of below $10^{-5}$ Torr, and dissociation, excitation, ionization, etc. of gas molecules can efficiently take place owing to a high kinetic energy level of electrons, as compared with DC or RF discharge of 13.56 MHz. In FIG. 2, numeral 21 is a magnetron, 22 an isolator, 23 a power monitor, 24 a wave guide, 25 electromagnets, 26 a plasma stream, 27 an evaporation source, 28 a shutter, 29 a stream of evaporated metal atoms, 30 a manipulator, 31 a substrate, 32 a discharge tube, and 33 a vacuum chamber.

In FIG. 3, a plasma stream, as viewed from the side of the vacuum chamber, is shown, where the plasma as transported along the magnetic flux from the circular discharge tube 32, 10 cm in diameter, is well confined.

DETAILED DESCRIPTION OF THE INVENTION

Examples of forming an insulator film according to the present plasma treatment system will be described in detail below.

EXAMPLE 1

Figure 1:
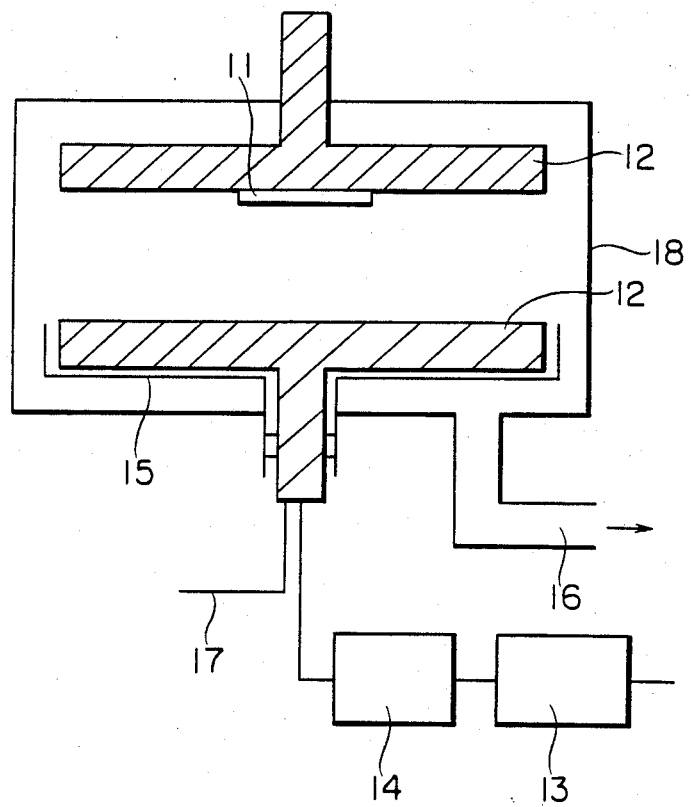
FIG. 1 shows a conventional type plasma CVD apparatus.
Figure 2:
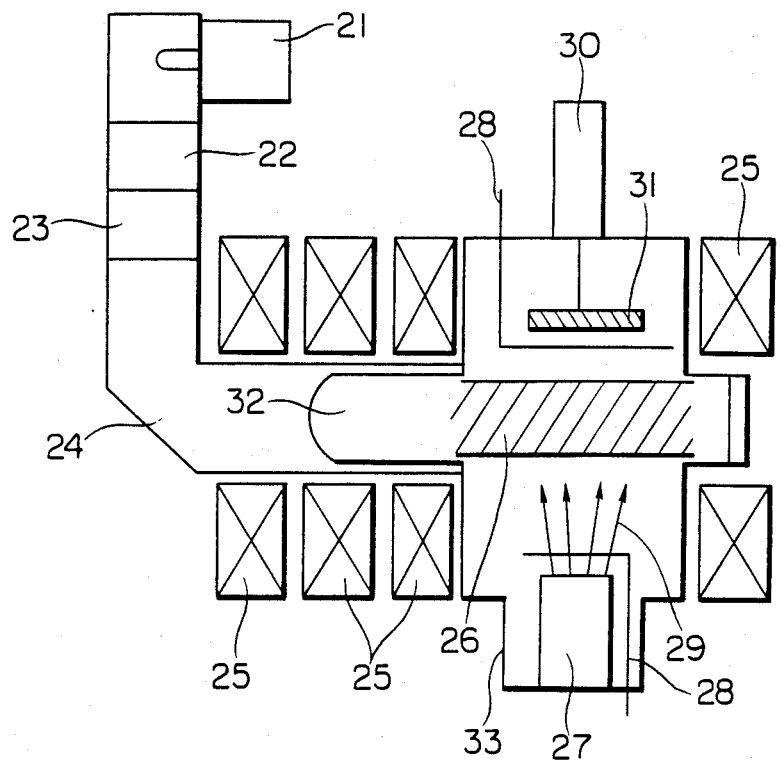
FIG. 2 shows the present plasma treatment system.
Figure 3:
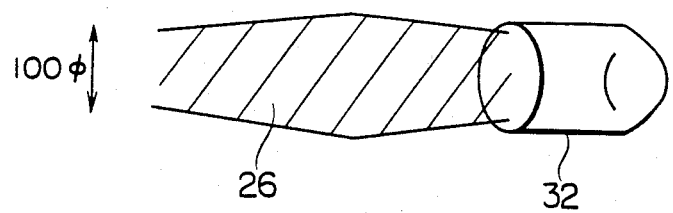
FIG. 3 shows the plasma stream produced in the present system.
Figure 4:
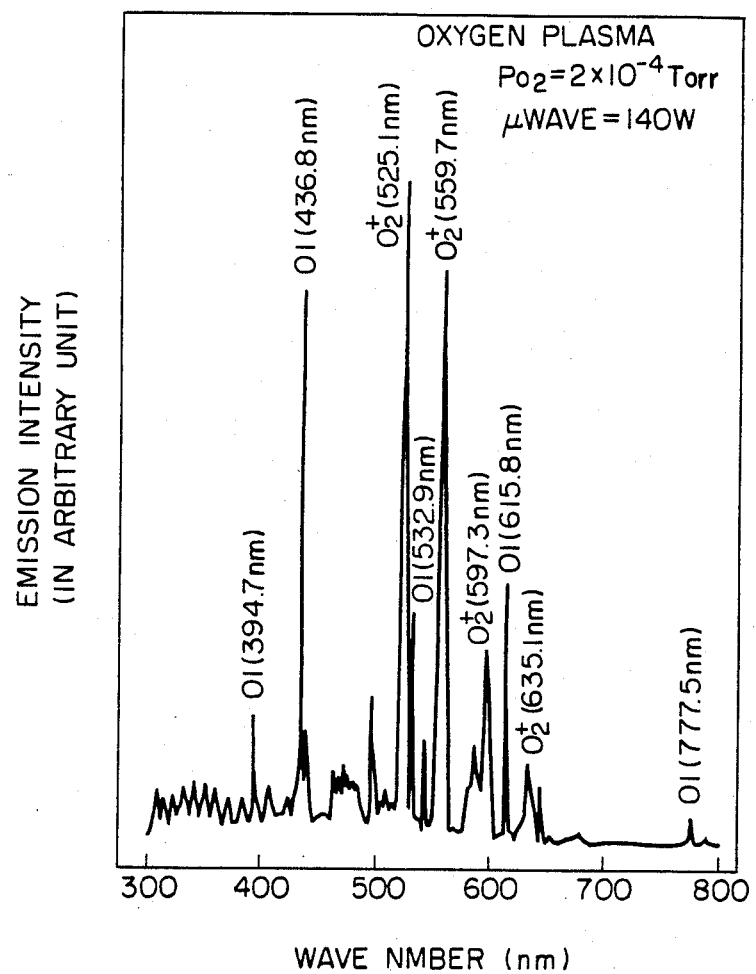
FIG. 4 is a diagram showing emission spectra from oxygen plasma.
Figure 5:
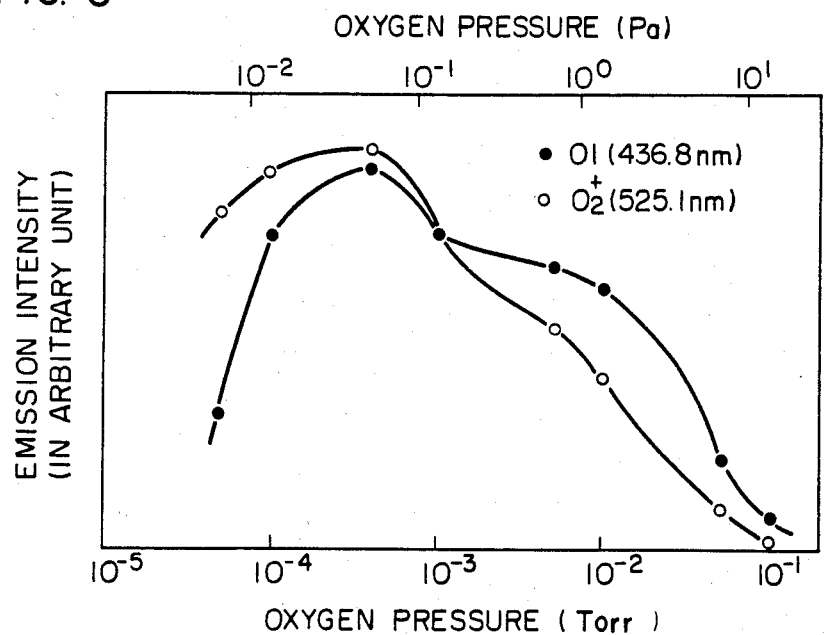
FIG. 5 is a diagram showing the oxygen pressure dependency of emission spectra.

This example shows formation of a $SiO_2$ film by utilizing reaction between oxygen plasma and evaporated Si. FIG. 4 shows emission spectra of oxygen plasma investigated to identify active species existing in an oxygen plasma under an oxygen gas pressure of $2 \times 10^{-4}$ Torr and a microwave power of 140 W as measured by a power monitor, where intense peaks that seem to be emissions from oxygen atoms and somewhat broad peaks that seem to be emissions from oxygen molecule ions are observable. It is also seen therefrom that there are many very active oxygen species in the oxygen plasma. In FIG. 5 a relationship between relative intensity of emission and gas pressure is shown with respect to the emission from oxygen atom (436.8 nm) and that from oxygen molecule ion. It is seen from FIG. 5 that the individual emission intensity has a maximum under a pressure of about $2 \times 10^{-4}$ Torr. Below that pressure, the emission from the oxygen molecule ion is more intensified, whereas above that pressure the emission from the oxygen atom is more intensified. In view of the fact that the oxygen molecule has an ionization energy of about 12 eV, and its dissociation takes place at about 5 eV, less collisions take place in a zone where the gas pressure is lower and the mean free path of particles is longer. Thus, the kinetic energy of electrons is higher and ionization efficiently takes place. On the other hand, when the gas pressure is higher, a chance of collision increases, and thus the kinetic energy of electrons is lowered, and a frequency of dissociation becomes higher than that of ionization. Thus, there seems to exist a pressure dependency of emission intensity. It seems that the emission intensity is proportional to the concentration of active species in the plasma, and thus a gas pressure of about $2-5 \times 10^{-4}$ Torr is used in the following film formation with a microwave power of 140 W.

An oxygen plasma is generated under the foregoing conditions, and subjected to reaction with evaporated Si to deposit $SiO_2$ on a substrate. Since the melting point of Si is high, an E-type electron gun, which will be hereinafter referred to as "E-gun", is used as an evaporation source. The operation pressure of E-gun is $1 \times 10^{-4}$ Torr, which is substantially equal to the oxygen pressure in the vacuum chamber, and thus an alloy of platinum-rhenium that withstands against an oxidizing ambient atmosphere is used as a filament.

Figure 6:
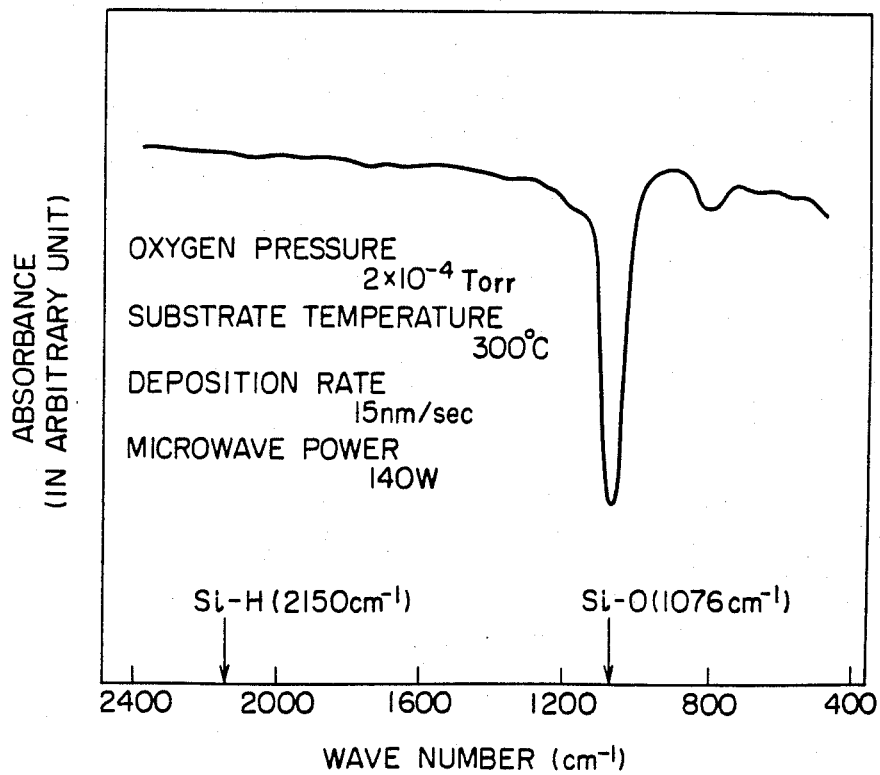
FIG. 6 is a diagram showing the infrared absorption property of plasma $SiO_2$ film produced in the present system.

In FIG. 6, infrared absorption characteristics of a $SiO_2$ film formed on a substrate through reaction between the oxygen plasma and the evaporated Si atoms on the basis of the foregoing principle are shown, where the oxygen pressure is $2 \times 10^{-4}$ Torr, and the deposition rate is about 15 nm/sec. As a obvious from FIG. 6, a sharp peak based on the vibration-contraction of Si and O is observable at the wave number of 1,076 $cm^{-1}$ (wavelength 9.3 $\mu m$), and it is seen that a $SiO_2$ film is formed. The most important characteristic is that any Si—H bond, as is always detectable in the conventional PCVD film based on the decomposition of $SiH_4$, is not observable at all at the wave number of 2,150 $cm^{-1}$. This is, of course, due to the utilization of direct reaction between the oxygen plasma and the Si atoms in the present invention.

Figure 7:
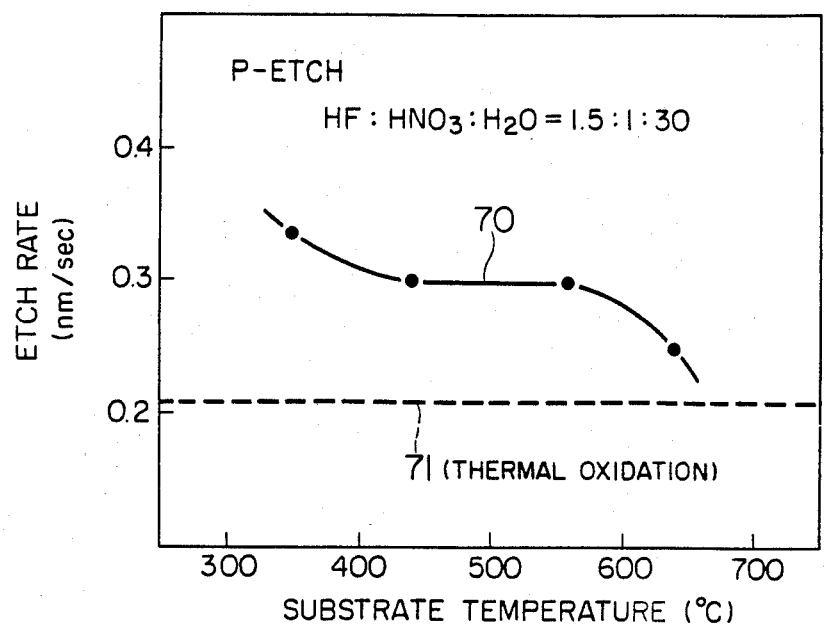
FIG. 7 is a diagram showing the relationship between the etch rate of plasma $SiO_2$ film and the substrate temperature.

Results of investigating the etch rate of the formed film to investigate the densification of the film are given by curve 70 in FIG. 7. The etching solution is a pliskin etching solution of $HF-HNO_3-H_2O$ in a ratio of $HF:HNO_3:H_2O$ of 1.5:1:30 by volume. Dotted line 71 in FIG. 7 shows an etch rate of thermal oxidation film at 1,000° C. for comparative purpose. The etch rate of the present film approximates to that of the thermal oxidation film at a substrate temperature of 600° C., and the dense film equivalent to the thermal oxidation film can be obtained, whereas at a substrate temperature of 300° C., the etch rate of the present film is 1.5 times as high as that of the thermal oxidation film, and the present film seems to be somewhat inferior to the thermal oxidation film in the densification, but in view of the fact that the etch rate of a film formed by sputtering or vapor deposition is higher in one or two orders than that of the thermal oxidation film, it can be said that the densification of the film formed at a lower temperature according to the present invention is considerably satisfactory.

Figure 8:
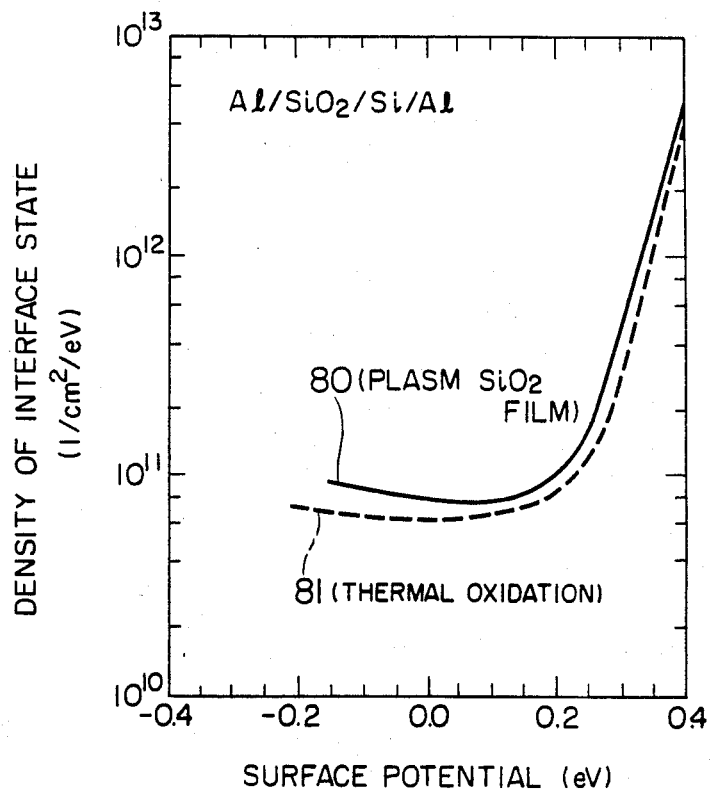
FIG. 8 is a diagram showing the density of interface state of the plasma $SiO_2$ film.

As described above, the plasma is confined by use of an external magnetic field in the present system, and thus the substrate is prevented from direct contact with the plasma. That is, the irradiation damage of the substrate due to collision of charged particles can be greatly controlled. The influence of irradiation damage is evaluated by investigating the interface property of a MOS (metal-oxide-semiconductor) capacitor. Specifically, a 900 nm-thick Al film is vapor deposited on the formed plasma oxidation film in a vacuum vapor deposition apparatus to prepare a MOS capacitor having such a structure as $Al/SiO_2/Si/Al$ and the density of interface state is estimated from a difference in the capacity between a high frequency and a low frequency (actually quasi-static state by applying a lamp voltage thereto). The results are shown by curve 80 in FIG. 8. Results from a thermal oxidation film formed at 1,000° C. is shown by curve 81 in FIG. 8 for comparative purpose. No thermal treatment after the Al vapor deposition is applied to these MOS capacitors.

The density of interface state of the thermal oxidation film in the midgap of Si is $7 \times 10^{10}/cm^2/eV$, which is larger than that of a MOS capacitor using polycrystalline Si, etc. as an electrode material. This seems to be due to the damage during the Al evaporation. It is seen from the results of plasma oxidation film that the density of interface state is $8 \times 10^{10}/cm^2/eV$, which is slightly larger than that of the thermal oxidation film. When compared with the fact that the density of interface level before thermal treatment of an oxidation film formed by plasma anodization while maintaining a substrate into plasma and applying a voltage to the substrate, thereby pulling in ions, etc. is up to $10^{12}/cm^2/eV$, the interface characteristics of the oxidation film formed in the present invention are found to be much distinguished.

It is apparent from the foregoing results that the present plasma treatment system is applicable not only to formation of an insulator film for a passive element such as an interlevel insulator film for LSI, but also to formation of an insulator film for an active element such as a MOS transistor.

EXAMPLE 2

This example shows formation of a $Si_3N_4$ film by utilizing direct reaction between the nitrogen plasma and the evaporated Si.

Generally, nitrogen is less dissociable than oxygen and there have been many reports disclosing that an emission from nitrogen molecular ions is observable in a discharge system under a high gas pressure on a low kinetic energy level of electrons as in DC glow discharge or in a high frequency discharge at 13.56 MHz, but no emission from nitrogen atoms is observable. On the other hand, in a microwave discharge utilizing ECR discharge as in the present system, a stable discharge under a low gas pressure is possible, and the kinetic energy of electrons is high enough to cause efficient dissociation.

When a nitrogen gas under $2 \times 10^{-4}$ Torr is introduced into a vacuum chamber to cause electric discharge with a microwave power of 140 W, distinct line spectrum from nitrogen atoms is observable around 400 nm. It seems therefrom that in the DC glow discharge or high frequency discharge, the nitrogen atoms, though formed, have a short life and undergo recombination to form nitrogen molecules, whereas in the microwave discharge, nitrogen atoms having a long life can be formed.

Figure 9:
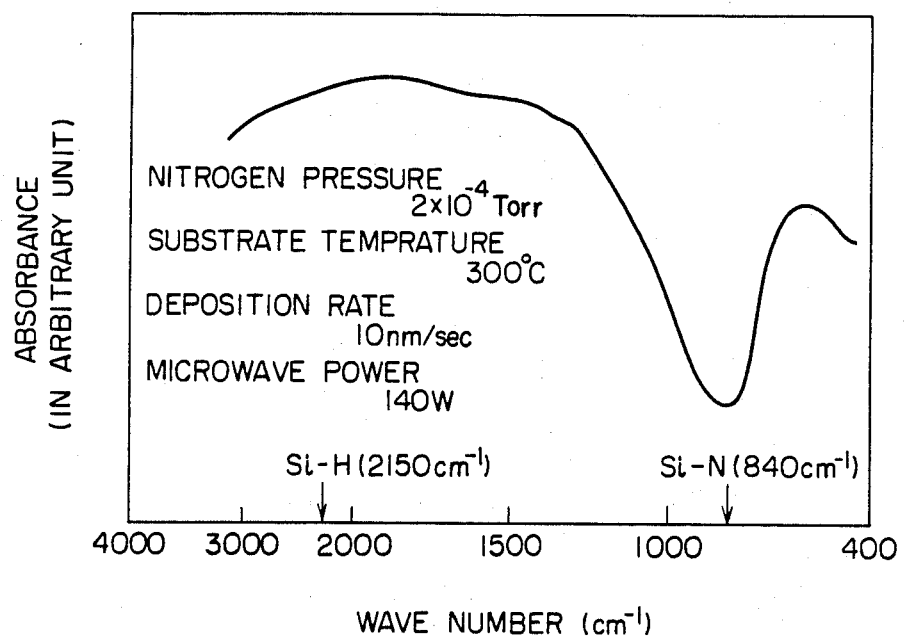
FIG. 9 is a diagram showing the infrared absorption characteristics of plasma $Si_3N_4$ film.

FIG. 9 shows ultraviolet absorption characteristics of a $Si_3N_4$ film formed under such conditions as a nitrogen partial pressure of $2 \times 10^{-4}$ Torr, a substrate temperature of 300° C., and a microwave power of 140 W, where an absorption due to the vibration-contraction of Si and N is observable at 840 cm$^{-1}$, and it is seen therefrom that a $Si_3N_4$ film has been formed. As in said $SiO_2$ film, no absorption due to the bond of Si and H is observable at 2,150 cm$^{-1}$, and it is seen therefrom that the film contains no hydrogen. Comparison of the deposition rate of the film with that of said $SiO_2$ film reveals that, to form a $Si_3N_4$ film satisfying the stoichiometrical composition, it is necessary to make the evaporation rate of Si lower than in the case of the $SiO_2$ film, because it seems that nitrogen is less dissociable than oxygen and also its reaction with Si takes place less.

Description has so far been focussed on formation of the $SiO_2$ film and the $Si_3N_4$ film. By introducing hydrogen into the vacuum chamber to generate a hydrogen plasma and reacting the plasma with evaporated Si, amorphous hydrogenated silicon which is important in a solar cell, etc. can be readily produced. The present system is characterized by plasma treatment while providing a substrate distant from the plasma, but it is readily possible in the present invention to place the substrate in the plasma to utilize the irradiation effect of charged electrons and thereby to improve the quality of film. This is to improve the densification of an insulator film, though the irradiation damage of the substrate is acceptable to some degree. That is, the insulator film to be formed can be densified by the irradiation of charged particles.

In the present plasma treatment system, it is possible to form an insulator film such as a $SiO_2$ film, a $Si_3N_4$ film, etc. even at a low temperature such as 300° C., and the film thus formed contains no hydrogen at all. This is a distinguished characteristic of the present invention. Thus, even if applied to LSI, etc., the film thus formed can be prevented from degradation due to the injection of hot electrons and trapping of electrons, and the long-term reliability of the device can be increased. Furthermore, since it is possible to form the film at a low temperature, the present invention is applicable to formation of an insulator film for a thin film transistor using a low melting point substrate or formation of a device, to which a high temperature process for forming an insulator film is not applicable, for example, three-dimensional devices. Furthermore, owing to less irradiation damage due to the charged particles in the plasma, an insulator film for an active element such as a gate insulator film for a MOS transistor can be formed at a low temperature.

Having described specific embodiments of the invention, it is obvious that modification and variation of the invention is possible in the light of the above teachings.

What is claimed is:

1. A plasma treatment apparatus for treating a substrate with a plasma, which comprises a magnetron for generating a microwave, a discharge tube for having a plasma generated therein, a wave guide for leading the microwave from the magnetron to the discharge tube, whereby the microwaves are used to generate the plasma, a vacuum chamber, an evaporation source provided in the vacuum chamber, to provide vaporized metal or alloy, a substrate holder for holding a substrate to be treated, the substrate holder being provided at a position to sandwich a stream of the plasma between the substrate and the evaporation source, in the vacuum chamber and electromagnets provided around the discharge tube and the vacuum chamber, the electromagnets generating a magnetic field to confine the stream of the plasma so as to isolate the plasma from the walls of the vacuum chamber to prevent contamination of the substrate with sputtering of the walls of the chamber, and so as to isolate the substrate itself from the plasma to prevent the substrate from irradiation damage due to direct irradiation by the plasma.

2. A plasma treatment apparatus according to claim 1, wherein a stream of the plasma is made to cross a stream of evaporated metal atoms, thereby forming a compound of the metal and depositing the compound onto the substrate.

3. A plasma treatment apparatus according to claim 1, wherein oxygen, nitrogen, hydrogen or their mixture gas is used as a gas for generating a stream of the plasma, thereby depositing an oxide, a nitride or a hydride of the metal onto the substrate.

4. A plasma treatment apparatus according to claim 1, wherein an silicon oxide film or a silicon nitride film is deposited on the substrate.

5. A plasma treatment apparatus according to claim 4, wherein a power of the microwave generated by the magnetron is 140 W.

6. A plasma treatment apparatus according to claim 5, wherein a gas pressure in the vacuum chamber is $2$–$5 \times 10^4$ Torr.

7. A plasma treatment apparatus according to claim 6, wherein the evaporation source is an E-type electron gun with a filament of platinum-rhenium alloy.

8. A plasma treatment apparatus according to claim 7, wherein the temperature of the substrate is 300° C.

9. A plasma treatment apparatus according to claim 1, further comprising a manipulator for manipulating the substrate.

10. A plasma treatment apparatus according to claim 1, further comprising an isolator for isolating the wave guide from the magnetron.

11. A plasma treatment apparatus according to claim 1, wherein the magnetron is a magnetron for generating microwaves of 2.45 GHz.

12. A plasma treatment apparatus according to claim 11, wherein the electromagnets are electromagnets for generating a magnetic field of 875 gauss in the center of the discharge tube.

13. A plasma treatment apparatus according to claim 1, wherein the vacuum chamber is integrally formed together with the discharge tube.

* * * * *